(12) United States Patent
Ogishima

(10) Patent No.: US 7,672,186 B2
(45) Date of Patent: Mar. 2, 2010

(54) ANTIFUSE REPLACEMENT DETERMINATION CIRCUIT AND METHOD OF SEMICONDUCTOR MEMORY DEVICE

(75) Inventor: Masamichi Ogishima, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 82 days.

(21) Appl. No.: 12/129,168

(22) Filed: May 29, 2008

(65) Prior Publication Data
US 2008/0298145 A1 Dec. 4, 2008

(30) Foreign Application Priority Data
Jun. 1, 2007 (JP) ............................. 2007-146718

(51) Int. Cl.
G11C 11/00 (2006.01)
(52) U.S. Cl. .................................... 365/225.7; 365/201
(58) Field of Classification Search .............. 365/225.7, 365/201
See application file for complete search history.

(56) References Cited
U.S. PATENT DOCUMENTS
5,420,821 A * 5/1995 Rhee .......................... 365/200
5,487,040 A * 1/1996 Sukegawa et al. ........... 365/200
5,953,266 A * 9/1999 Shore ......................... 365/200
6,784,043 B2 * 8/2004 Carson et al. ................ 438/209

FOREIGN PATENT DOCUMENTS
JP 2002-074980 3/2002

* cited by examiner

Primary Examiner—Michael T Tran
(74) Attorney, Agent, or Firm—Sughrue Mion, PLLC

(57) ABSTRACT

An antifuse replacement determination circuit of a semiconductor memory device, in which the address of a bad memory cell is stored by destroying the insulation of an antifuse element, includes a charging circuit for charging a node of the antifuse element to have a predetermined voltage, and making the charge at the node self-discharge via the antifuse element after the charging of the node is completed; a comparison and determination circuit for comparing the voltage at the node of the antifuse element with a plurality of reference voltages when a predetermined time has elapsed after the completion of the charging of the node; and a determination part for determining, based on a determination result with respect to the comparison using the plurality of reference voltages in the comparison and determination circuit, whether or not replacement of the bad memory cell has been performed normally by using the antifuse element.

13 Claims, 8 Drawing Sheets

FIG.3B

| | Verify DETERMINATION | APPLICATION OF SAMPLE |
|---|---|---|
| S1 NOT DESTROYED: X0 LEVEL ≧ Verify1 (1.35V) | Pass | NO Store |
| S2 NOT DESTROYED: X0 LEVEL < Verify1 (1.35V) | Fail | NG |
| S3 NOT DESTROYED: X0 LEVEL < Verify2 (0.95V) | Fail | NG |
| S4 DESTROYED: X0 LEVEL ≧ Verify1 (1.35V) | Fail | NG |
| S5 DESTROYED: X0 LEVEL < Verify1 (1.35V) | Pass | TO Verify2 |
| S6 DESTROYED: Verify2 (0.95V) ≦ X0 LEVEL < Verify1 (1.35V) | Fail | TO Verify2 |
| S7 DESTROYED: X0 LEVEL < Verify2 (0.95V) | Pass | TO RE-SCREENING |
| S8 (S7: Pass)→X0 LEVEL < Load (1.10V) →RE-SCREENING: Pass | Pass | Pass |
| S9 (S7: Pass)→X0 LEVEL ≧ Load (1.10V) →RE-SCREENING: Fail | Pass | NG |

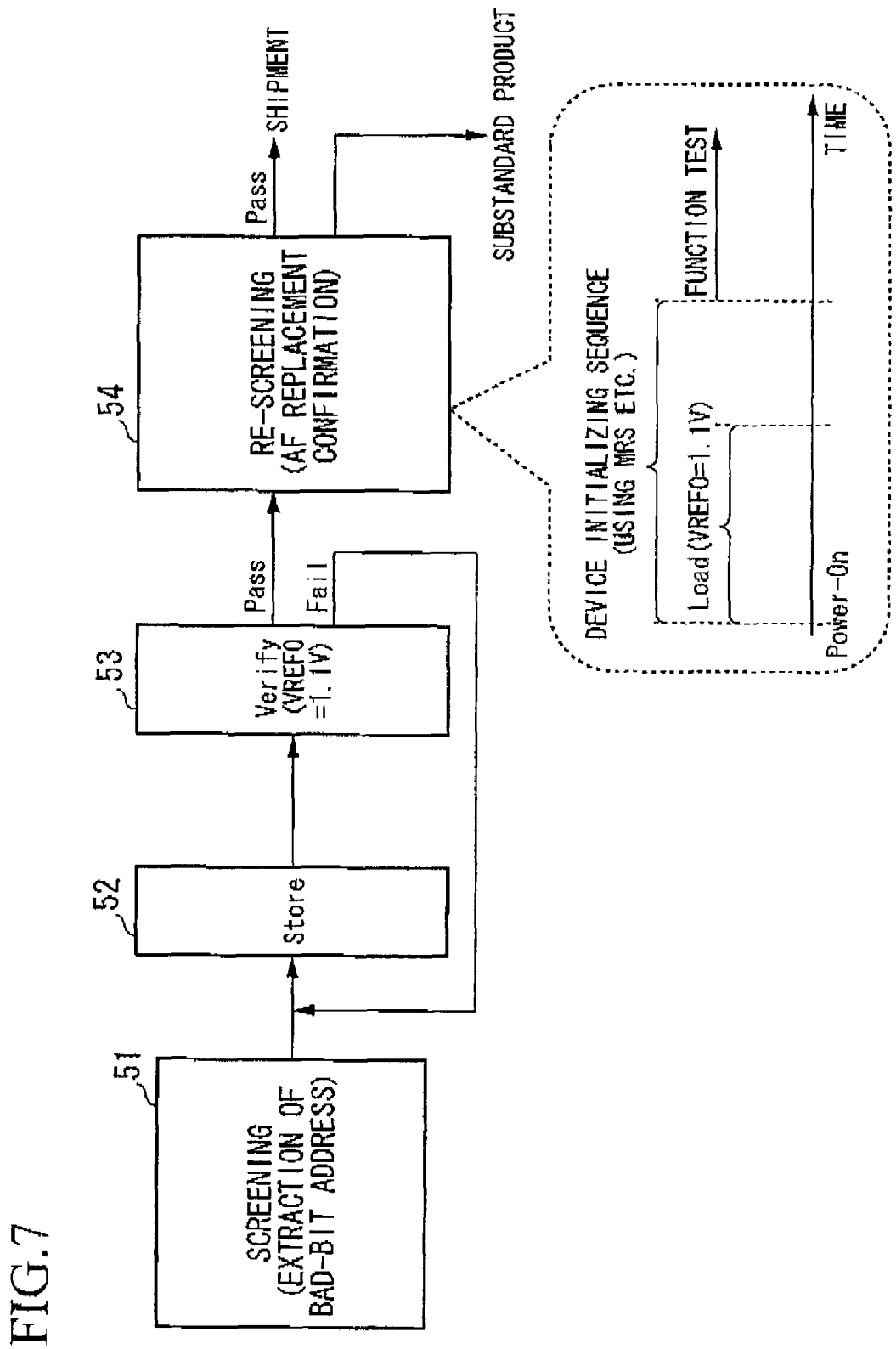

ANTIFUSE REPLACEMENT DETERMINATION CIRCUIT AND METHOD OF SEMICONDUCTOR MEMORY DEVICE

BACKGROUND OF THE INVENTION

1. Field of the Invention

The present invention relates to an antifuse replacement determination circuit of a semiconductor memory device, and in particular, those circuits for detecting that the replacement using an antifuse element has been reliably performed, and also relates to a relevant antifuse replacement determination method.

Priority is claimed on Japanese Patent Application No. 2007-146718, filed Jun. 1, 2007, the contents of which are incorporated herein by reference.

2. Description of the Related Art

With respect to dynamic memory circuits, a so-called "AF (antifuse) circuit" is known, in which an address of a bad bit (i.e., a bad memory cell) is stored by destroying a semiconductor element (a capacitance element or a MOS transistor), and when this address is selected, data is stored not in an ordinary DRAM memory cell, but in an SRAM element (or a flip-flop circuit). In the following description, such a replacement of an ordinary memory cell with an SRAM element (or a flip-flop circuit) is called "replacement by AF" or "AF replacement". In addition, the destroyed semiconductor element is called an "AF element".

When a memory device having an AF circuit is initialized so as to be actually used, the target address with respect to the AF replacement should be defined (this is called "Load", which will be explained in detail later) by determining whether the relevant AF element has been destroyed. Such a determination is performed by supplying, in advance, an (electric) charge having a specific level to a node (or contact point) in the vicinity of a node of the AF element, and comparing the level of the charge with a reference level so as to determine whether the charge has escaped through the node due to the destruction of the AF element. Generally, the reference level is set to an optimum value for determining whether or not the AF element has been destroyed (called "AF destruction determination" below).

With respect to DRAMs, the yield decreases when a device, which does not normally operate and is determined to be a substandard product in a screening process, is found. Such a decrease in the yield prevents the reduction of the screening and forwarding cost. Recently, in most cases, approximately one or two bits which have a physical defect in each relevant memory cell cause a substandard product. Therefore, when such one or two bits are replaced by an AF circuit so as to produce a standard product the screening yield can be improved, and the manufacturing cost can be reduced.

More specifically, when one bit is replaced, the AY circuit generally have a number of AF elements, the number corresponding to the number of addresses (e.g., 26 addresses, where X=X0 to X13, Y=Y0 to Y9, Bank0, and Bank1); corresponding AF circuits for destroying and determining the AF elements; and another AF element and another AF circuit for determining whether the antifuse of the relevant one bit is to be activated. That is, when there are 26 addresses, 27 sets of the AF element and the AF circuit are provided.

When a substandard product is found in a screening process, first, the address of the bad bit is confirmed, and the AF element corresponding to this address is destroyed. This operation is called "Store", and the process of performing Store is called a "Store process". Next, it is confirmed if the address, which has been stored due to the destruction of the AF element, coincides with the anticipated address. This operation is called "Verify", and the process of performing Verify is called a "Verify process".

After that, AF replacement is performed, and normal operation of the relevant DRAM is confirmed by performing the screening process again. In the normal function of re-screening or ordinary use thereafter, when the relevant DRAM is initialized immediately after the power-on, an AF destruction determination similar to the above Verify is performed, and the result thereof is latched (i.e., stored). This operation is called "Load", and the process of performing Load is called a "Load process".

When the address of the relevant bit, to which the AF replacement has been applied, is selected, data is written to or read from the relevant SRAM or flip-flop, instead of the corresponding DRAM memory cell, in accordance with an AF hit signal which is output from the relevant AF circuit based on the determination result stored in the Load process. As a bad memory cell is replaced with an SRAM or flip-flop, the relevant device, which is determined to be a substandard product without AF replacement, is converted into a standard product.

FIG. 5 shows a conventional AF destruction determination circuit. In FIG. 5, an AF destruction determination sequence control part 1A controls each part shown in FIG. 5 so as to perform the AF destruction determination. A charging control part 2 generates a "/Charge" signal for charging a node (or contact point) X1 of an AF element 11 via a node X0 in the vicinity of the AF element 11. A Verify execution part 3A generates a Verify signal for commanding the execution of the Verify process. A Load execution part 5 generates a Load signal for commanding the execution of the Load process. An AF destruction result determination part 6 determines whether a result of the AF destruction determination coincides with the anticipated result based on a determination result BB obtained through the Verify and Load processes.

Although detailed explanations of the AF element 11 and an AF element destruction circuit 12 are omitted, a DRAM-cell capacitance element or an N-channel transistor is used as the AF element and the AF element destruction circuit 12 generates and controls a high voltage for destructing such a capacitance element or a gate oxide film of the transistor. The AF element has the node X1, and the other node thereof is ordinarily connected to VSS (the source potential). Therefore, the node X1 of the destroyed AF element is conductive with VSS (via a low resistance).

The gate of a P-channel transistor P1 is connected to the output of a NOR circuit 13. When the Verify or Load signal input into the NOR circuit 13 has a value of "1", the P-channel transistor P1 is switched on. That is, in the Verify and Load processes, a control for making the node X1 of the AF element be conductive with the node X0 of a comparison and determination circuit 20 ("AMP").

In the Verify and Load processes, a P-channel transistor P0 is switched on when charging the nodes X0 and X1 to an initial precharge level VCHARGE (e.g., 1.4V) The comparison and determination circuit 20 compares the potential of the node X0 with a reference level VREF0 (e.g., 1.1V). A flip-flop circuit 30 above the comparison and determination circuit 20 latches (i.e., stores) a determination result BB output from the comparison and determination circuit 20.

Below, the relevant AF destruction determination in accordance with a conventional technique will be explained with reference to FIGS. 5 and 6. In the AF destruction determination in the structure of FIG. 5, first, (i) the P-channel transistor P1 is switched on by means of the Verify or Load signal, so that the nodes X0 and X1 are conductive with each other, and (ii) the P-channel transistor P0 is switched on by means of the /Charge signal (see time t1 in FIG. 6), so as to precharge the nodes X0 and X1 to the level VCHARGE. This process corresponds to the "precharge period T1 using VCHARGE" in FIG. 6.

Next, the state of the /Charge signal is switched so as to switch off the P-channel transistor P0, thereby setting the nodes X0 and X1 to be in a floating state (see time t2 in FIG. 6). If the AF element 11 has not been destroyed, no charge loss occurs at the nodes X0 and X1, and thus they maintain the level VCHARGE (here, 1.4V, see the discharge curve Ds1 in FIG. 6). This level is higher than the reference level VREF0 (here, 1.1V) applied to the other input of the comparison and determination circuit 20. Therefore, a result of the AF destruction determination, which indicates that the AF element has not been destroyed, is obtained, and is stored as the determination result BB. In this case, as the anticipated value with respect to Verify indicates that the AF element has not been destroyed, it coincides with BB, so that the result of Verify is "Pass" (which means passing the relevant examination).

If the AF element 11 has been destroyed, the node X1 is conductive with the other node VSS, so that charge loss occurs from the nodes X0 and X1, and the potential levels thereof decrease (see the discharge curve Ds2 in FIG. 6). When the decreased level is lower than VREF0 (1.1V), a result of the AF destruction determination, which indicates that the AF element has been destroyed, is obtained, and is stored as the determination result BB. In this case, as the anticipated value determined in Verify indicates that the AF element has been destroyed, it coincides with BB, so that the result of Verify is Pass.

The speed and level of the above decrease with respect to the nodes X0 and X1 are considerably affected by the degree of the destruction of the AF element. That is, when the AF element has been sufficiently destroyed, it has a sufficiently low resistance, and the potential of the node X0 becomes sufficiently lower than VREF0 (1.1V). In this case, the determination is accurately performed. However, when the AF element has not been sufficiently destroyed, it has a relatively high resistance, so that the decreasing speed of the potential of the node X0 is low, and the potential level stays around VREF (1.1V) (see the discharge curve Ds3 in FIG. 6).

When the potential of the node X0 stays higher than VREF (1.1V), the result of the AF destruction determination, which indicates that the AF element has not been destroyed, is obtained even though the operator or user believes that the AF element has been destroyed. As this result is stored as BB, it does not coincide with the relevant anticipated value, so that the result of Verify is "Fail" (which indicates failing the relevant examination).

The above-described process corresponds to the "X0-reference level comparison and determination period T2", in which the level of the /Charge signal is high, the P-channel transistor P0 is switched off, and the comparison and determination circuit 20 is activated.

With respect to a device, which has been determined to be a Fail device in the Verify process, no address replacement by means of the AF element 11 is performed in the Load process during actual use. In the re-screening process performed after the AF replacement process) or during actual use, a DRAM memory cell (in such a device), which has been determined to be a bad cell in the former screening, is selected, so that the device is determined to be a substandard product, and thus does not contribute to an increase in the yield. Therefore, the operation from the Store process is performed again.

The relevant conventional AF replacement processes will be shown in FIG. 7. In a screening process 51, a bad address is extracted from a device which is determined to be a substandard product. The AF element 11 corresponding to the above address is destroyed in a Store process 52. In a Verify process 53, the result of the AF element destruction is confirmed by the Verify operation using VREF0 (1.1V) as the reference voltage. When the relevant device obtains a result of Pass, it is forwarded to the next rescreening process 54.

In a DRAM initializing sequence of the re-screening process 54, an AF destruction determination similar to that performed in the Verify process 53 is performed in the Load operation. The result thereof is stored, and the relevant bad bit is replaced by means of the AM element 11, so that the device which obtains the Pass result is forwarded for shipment.

On the other hand, a device which obtains a Fail result in the Verity process 53 is subjected to the Store process 52 again, so as to repeat the series of the relevant processes until it obtains a Pass result in the Verify process 53.

The most serious problem with respect to the above-described AF replacement is that the decreased potential of the node X0 reaches almost the same level of VRFF0 (1.1V) due to insufficiently-decreased resistance of the AF element b this case, every time the AF replacement determination is performed, a different result may be obtained. For example, if a device obtains a Pass result (in the Verify process 53) due to "the level at X0<VREF0" (which is narrowly satisfied) by which it is determined that the AF element has been destroyed, ten it may be determined that the AT element has not been destroyed (in the Load operation of the re-screening process 54) due to "the level at X0>VREF0". In this case, this device is determined to be a substandard product in the relevant re-screening process, and cannot contribute to an increase in the yield. Additionally, if such a device accidentally obtains a Pass result in the re-screening process 54 due to a determination that the AF element has been destroyed, and it is determined in the Load process during actual use (after the shipment) that the AF element has not been destroyed, then it causes a worse result such as the occurrence of a substandard market product.

In a conventional semiconductor integrated circuit device disclosed in Patent Document 1 (Japanese Unexamined Patent Application, First Publication No. 2002-074980), a specific node (e.g., "FUADD" in FIG. 1) is monitored so as to determine whether or not the relevant fuse should be subjected to a programmed operation.

As described later, the present invention provides a voltage comparison circuit for comparing the voltage at a node of the AM element with a plurality of reference voltages so as to more reliably determine the destruction or non-destruction of the AF element. Therefore, the method and structure for the determination are different between Patent Document 1 and the present invention.

As described above, in the conventional technique, a device having an unstable result of the AF replacement is obtained due to an insufficiently decreased resistance of the destroyed AF element and such a device does not contribute to an increase in the relevant yield, or produces a substandard market product as a worse result.

SUMMARY OF THE INVENTION

In light of the above circumstances, an object of the present invention is to provide an antifuse replacement determination circuit of a semiconductor memory device, and a relevant antifuse replacement determination method, so as to detect that the AF replacement has been reliably performed, and to prevent a substandard product from occurring due to an erroneous determination applied to the AF element in the re-screening process, thereby achieving an anticipated increase in the yield, and preventing au erroneous determination with respect to the AF element from occurring in actual use after the shipment.

Therefore, the present invention provides an antifuse replacement determination circuit of a semiconductor memory device, wherein:

the semiconductor memory device has a memory cell array in which data is stored in each memory cell, and the address of a bad memory cell is stored as a bad address by destroying the insulation of an antifuse element so as to replace the bad memory cell with another memory element;

it is determined by the antifuse replacement determination circuit whether or not the replacement of the bad memory cell has been performed normally by using the antifuse element; and the antifuse replacement determination circuit comprises:

an antifuse element charging circuit for charging a node of the antifuse element to have a predetermined voltage, and making the charge at the node self-discharge via the antifuse element after the charging of the node is completed;

a comparison and determination circuit for comparing the voltage at the node of the antifuse element with a plurality of reference voltages when a predetermined time has elapsed after the completion of the charging of the node; and an AF destruction result determination part for determining, based on a determination result with respect to the comparison using the plurality of reference voltages in the comparison and determination circuit, whether or not the replacement of the bad memory cell has been performed normally by using the antifuse element.

In the above structure, the node of the antifuse element is charged to have the predetermined voltage, and after the charging is completed, the charge at the node is made to self-discharge via the antifuse element. When the predetermined time has elapsed after the discharging starts, the voltage at the node of the antifuse element is compared with a plurality of reference voltages (e.g., three reference levels). For example, an insufficiently-destroyed mode is determined to be a failure by means of a comparison with the minimum reference level, while an erroneously-destroyed mode is determined to be a failure by means of a comparison with the maximum reference level, thereby performing a more strict judgment in comparison with the conventional techniques.

Accordingly, it is possible to detect that the relevant replacement using an AF element has been reliably performed, and thus to prevent the production of a substandard product due to an erroneous result of the AF-element destruction determination performed in re-screening or the like, thereby improving the relevant yield.

In a typical example:

the comparison and determination circuit includes three Comparison and determination circuits; and the antifuse replacement determination circuit has:

a first comparison and determination circuit for comparing the voltage at the node of the antifuse element with a first reference voltage VREF1;

a first latch circuit for storing a determination result with respect to the comparison of the first comparison and determination circuit;

a second comparison and determination circuit for comparing the voltage at the node of the antifuse element with a second reference voltage VREF2, wherein VREF1>VREF2;

a second latch circuit for storing a determination result with respect to the comparison of the second comparison and determination circuit;

a third comparison and determination circuit for comparing the voltage at the node of the antifuse element with a third reference voltage VREF0, wherein VREF1>VREF0>VREF2;

a third latch circuit for storing a determination result with respect to the comparison of the third comparison and determination circuit; and a transfer-gate part for selecting one of the determination results stored in the latch circuits and transmitting the selected result to the AF destruction result determination part.

In the above structure including the three comparison and determination circuits, the determination result obtained by each comparison arid determination circuit is transmitted to the AF destruction result determination pan via the transfer-gate part.

Therefore, the voltage at the node of the antifuse element can be compared with the relevant three reference voltages. Accordingly, it is possible to detect that the relevant replacement using an AF element has been reliably performed, and to prevent the production of a substandard product due to an erroneous result of the AF-element destruction determination performed in re-screening or the like, thereby improving the relevant yield.

In this case, preferably, the antifuse replacement determination circuit further includes:

a first determination executing part (e.g., a Verify1 execution part 3 in a first embodiment explained later) for making the first comparison and determination circuit compare the voltage at the node of the antifuse element with the first reference voltage VREF1, and transmitting the determination result stored in the first latch circuit to the AF destruction result determination part via the transfer-gate part;

a second determination executing part (e.g., a Verify2 execution part 4 in the embodiment) for making the second comparison and determination circuit compare the voltage at the node of the antifuse element with the second reference voltage VREF2, and transmitting the determination result stored in the second latch circuit to the AF destruction result determination part via the transfer-gate part; and a third determination executing part (e.g., a Load execution part 5 in the embodiment) for making the third comparison and determination circuit compare the voltage at the node of the antifuse element with the third reference voltage VRFF0, and transmitting the determination result stored in the third latch circuit to the AF destruction result determination part via the transfer-gate part.

In another typical example:

the comparison and determination circuit has a single comparison and determination circuit; and the antifuse replacement determination circuit has:

a transfer-gate part for selecting one of a first reference voltage VREF1, a second reference voltage VREF2, and a third reference voltage VREF0 for comparison with the voltage at the node of the antifuse element, and transmitting the selected reference voltage to the comparison and determination circuit, wherein VREF1>VREF0>VREF2;

a first determination executing part for making the transfer-gate part select the first reference voltage VREF1, and making the comparison and determination circuit compare the voltage at the node of the antifuse element with the first reference voltage VREF1;

a second determination executing part for making the transfer-gate part select the second reference voltage VREF2, and making the comparison and determination circuit compare the voltage at the node of the antifuse element with the second reference voltage VREF2;

a third determination executing part for making the transfer-gate part select the third reference voltage VREF0, and making the comparison and determination circuit compare the voltage at the node of the antifuse element with the third reference voltage VREF0; and a single latch circuit for storing a determination result with respect to the comparison of the comparison and determination circuit.

In this structure having a single comparison and determination circuit, and the reference voltage input into the comparison and determination circuit is selected by switching, so that the voltage at the node of the antifuse element can be compared with the relevant three reference voltages. Accordingly in addition to the effect that the voltage at the node of the antifuse element can be compared with the relevant tree reference voltages, the area of the antifuse replacement determination circuit can be reduced.

When including the first to third determination executing parts, typically, the AF destruction result determination part determines that:

the antifuse element is in a normal state when it is determined through the operation of the first determination executing part (e.g., the Verify1 execution part 3 in embodiments explained later) that the voltage at the node of the antifuse element is higher Man or equal to the first reference voltage VREF1 (corresponding to the maximum reference level in the embodiments), and the antifuse element has an anticipated value which indicates non-destruction;

the antifuse element has a failure when it is determined through the operation of the first determination executing part that the voltage at the node of the antifuse element is lower t the first reference voltage VREF1, and tie antifuse element has an anticipated value which indicates non-destruction;

the antifuse element is in a normal state when it is determined through the operation of the second determination executing part (e.g., the Verify2 execution part 4 in the embodiments) that the voltage at the node of the antifuse element is lower than the second reference voltage VREF2 (corresponding to the minimum reference level in the embodiments), and the antifuse element has an anticipated value which indicates destruction; and the antifuse element has a failure when it is determined through the operation of the second determination executing part that the voltage at the node of the antifuse element is higher than or equal to the second reference voltage VREF2, and the antifuse element has an anticipated value which indicates destruction.

Accordingly, an erroneously-destroyed mode can be determined to be a failure by means of a comparison with the first reference level VREF1 (i.e., the maximum reference level), while an insufficiently-destroyed mode can be determined to be a failure by means of a comparison with the second reference level VRFF2 (i.e., the minimum reference level), thereby performing a more strict judgment in comparison with the conventional techniques. Therefore, in a Load process during re-screening or ordinary use, a stable determination result can be obtained through a determination using the third reference level VREF0 (VREF1>VREF0>VREF2), thereby considerably reducing the occurrence of a substandard product during re-screening or ordinary use.

In this case, typically, when the antifuse element has an anticipated value which indicates destruction, if it is determined through the operation of the fist determination executing part that the voltage at the node of the antifuse element is lower than the first reference voltage VREF1, and it is also determined through the operation of the second determination executing part that the voltage at the node of the antifuse element is higher tan or equal to the second reference voltage VREF2 (i.e., VREF1>the voltage of the node>VREF2), then the AF destruction result determination part generates a signal for indicating a determination that the antifuse element should be destroyed again.

Accordingly, a product having an insufficiently-destroyed AF element can be saved, and no failure due to an erroneous determination of the AF element occurs in a re-screening process. Therefore, an anticipated increase in the relevant yield can be obtained. Also during actual use after the shipment, no erroneous determination of the AF element occurs, so that no substandard market product is produced.

Also typically, the AF destruction result determination part determines that:

the antifuse element is in a normal state when it is determined though the operation of the third determination executing part (e.g., the Load execution part 5 in the embodiments) that the voltage at the node of the antifuse element is higher than or equal to the third reference voltage VREF0 (corresponding to the intermediate reference level in the embodiments), and the antifuse element has an anticipated value which indicates non-destruction;

the antifuse element has a failure when it is determined through the operation of the third determination executing part that the voltage at the node of the ant se element is lower than the third reference voltage VREF0, and the antifuse element has an anticipated value which indicates non-destruction;

the antifuse element is in a normal state when it is determined through the operation of the third determination executing part that the voltage at the node of the antifuse element is lower than the third reference voltage VREF0, and the antifuse element has an anticipated value which indicates destruction; and the antifuse element has a failure when it is determined through the operation of the third determination executing part that the voltage at the node of the antifuse element is higher than or equal to the third reference voltage VREF0, and the antifuse element has an anticipated value which indicates destruction.

Therefore, after the AF-element destruction determination is performed using the first and second determination executing parts, it can be performed by the third determination executing part. Therefore, a stable determination result can be obtained, thereby considerably reducing the occurrence of a substandard product dug re-screening or ordinary use.

In a preferable example:

the predetermined voltage applied to the node of the antifuse element is 1.4V;

the first reference voltage VREF1 is 0.35V;

the second reference voltage VREF2 is 0.95V; and the third reference voltage VREF0 is 1.1V.

Accordingly, it is possible to reliably perform the destruction determination of the antifuse element by using a power source voltage of the semiconductor memory device.

The present invention also provides an antifuse replacement determination method used in a semiconductor memory device, wherein:

the semiconductor memory device has a memory cell array in which data is stored in each memory cell, and the address of a bad memory cell is stored as a bad address by destroying the insulation of an antifuse element so as to replace the bad memory cell with another memory element;

it is determined by the antifuse replacement determination method whether or not the replacement of the bad memory cell has been performed normally by using the antifuse element; and the antifuse replacement determination method comprises:

an antifuse element charging step of charging a node of the antifuse element to have a predetermined voltage, and making the charge at the node self-discharge via the antifuse element after the charging of the node is completed;

a comparison and determination step of comparing the voltage at the node of the antifuse element with a plurality of reference voltages when a predetermined time has elapsed after the completion of the charging of the node; and an AF destruction result determination step of determining, based on a determination result with respect to the comparison using the plurality of reference voltages in the comparison and determination step, whether or not the replacement of the bad memory cell has been performed normally by using the antifuse element.

In accordance with the above method, the node of the antifuse element is charged to have the predetermined voltage, and after the charging is completed, the charge at the node is made to self-discharge via the antifuse element. When the predetermined time has elapsed after the discharging starts, the voltage at the node of the antifuse element is compared with a plurality of reference voltages (e.g., three reference levels). For example, an insufficiently-destroyed mode is determined to be a failure by means of a comparison with the minimum reference level, while an erroneously-destroyed mode is determined to be a failure by means of a comparison with the maximum reference level, thereby performing a more strict judgment in comparison with the conventional techniques.

Accordingly, it is possible to detect that the relevant replacement using an AF element has been reliably performed, and thus to prevent the production of a substandard product due to an erroneous result of the AF-element destruction determination performed in re-screening or the like, thereby improving the relevant yield.

In accordance with the present invention, as the voltage of the node of the AF (antifuse) element is compared with a plurality of reference voltages, it is possible to detect that the replacement using the relevant AF element has been reliably performed. Therefore, it is possible to prevent the occurrence of a substandard product due to an erroneous result of the AF-element destruction determination in a re-screening process, thereby improving the relevant yield. Also during actual use after the shipment, no erroneous result of the AF-element destruction determination is obtained.

BRIEF DESCRIPTION OF THE DRAWINGS

FIG. 7 is a diagram for showing AF replacement processes with respect to the conventional semiconductor memory device.

DETAILED DESCRIPTION OF THE INVENTION

Hereinafter, embodiments of the present invention will be described with reference to the appended figures.

FIRST EMBODIMENT

Figure 1:
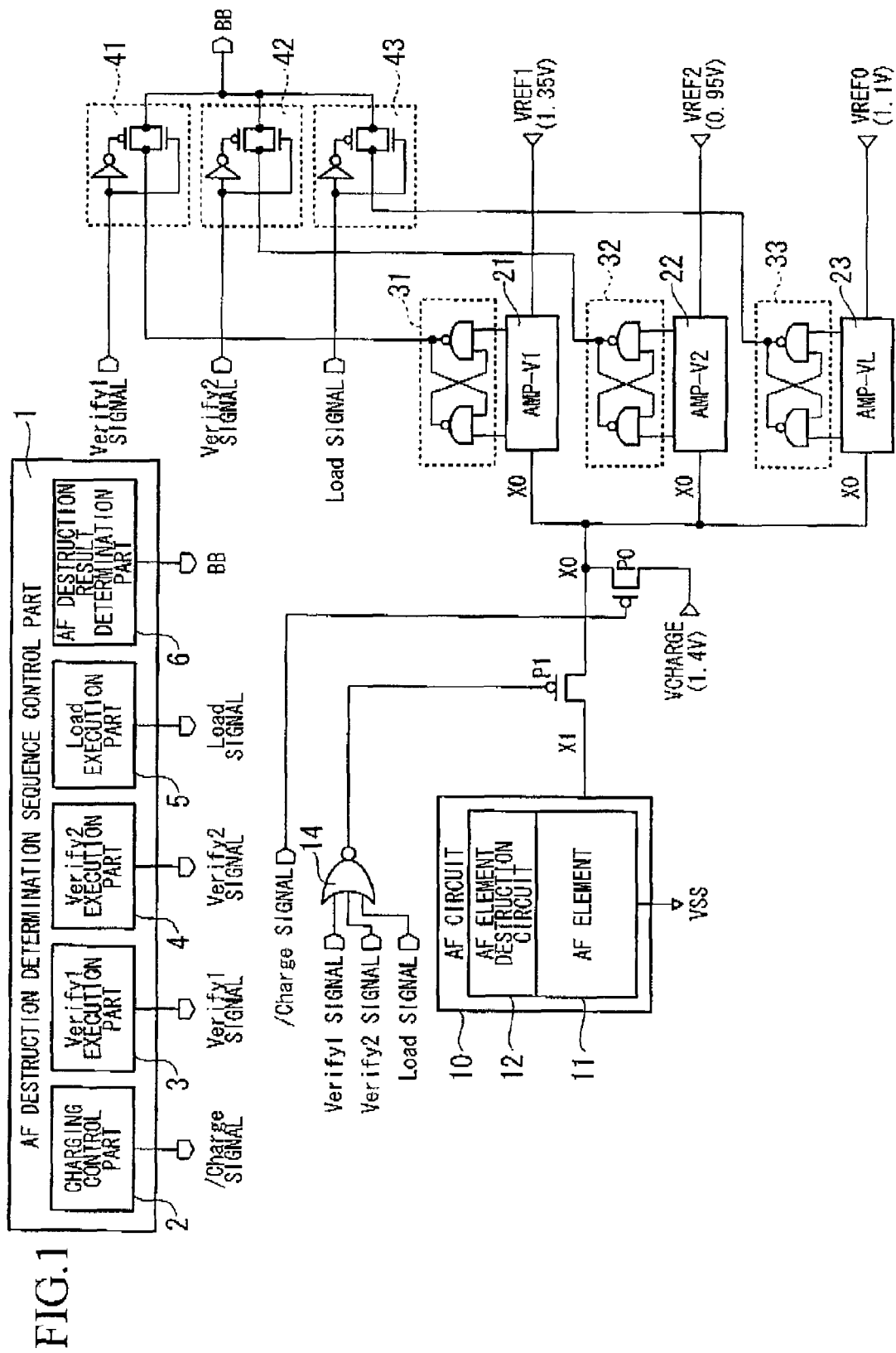
FIG. 1 is a diagram showing the structure of an antifuse replacement determination circuit of a semiconductor memory device, with respect to a first embodiment of the present invention.

FIG. 1 is a diagram showing the structure of an antifuse replacement determination circuit of a semiconductor memory device, with respect to a first embodiment of the present invention.

In FIG. 1, an AF destruction determination sequence control part 1 controls each part shown in FIG. 1 so as to perform the AF destruction determination. A charging control part 2 generates a "/Charge" signal for charging the nodes X0 and X1 of an AF element 11. A "Verify1" execution part 3 generates a Verity1 signal for commanding the execution of a Verify1 process. A "Verify2" execution part 4 generates a Verify2 signal for commanding the execution of a Verify2 process. A Load execution part 5 generates a Load signal for commanding the execution of the Load process. An AF destruction result determination part 6 determines whether a result of the AF destruction determination coincides with an anticipated result (destruction or non-destruction), based on a determination result BB obtained through the Verify1, Verify2, and Load processes, which use comparison and determination circuits.

Here, the first determination executing part, the second determination executing part, and the third determination executing part of the present invention are respectively implemented by the Verify1 execution part 3, the Verify2 execution part 4, and the Load execution part 5. In addition, the antifuse element charging circuit of the present invention is implemented by a circuit which includes P-channel transistors P0 and P1. Furthermore, the first, second, and third reference voltages of the present invention respectively correspond to VREF1, VREF2, and VREF0. Additionally, the first, second, and third comparison and determination circuits of the present invention are respectively implemented by comparison and determination circuits 21, 22, and 23. Furthermore, the first, second, and third latch circuits of the present invention are respectively implemented by flip-flop circuits 31, 32, and 33.

Figure 5:
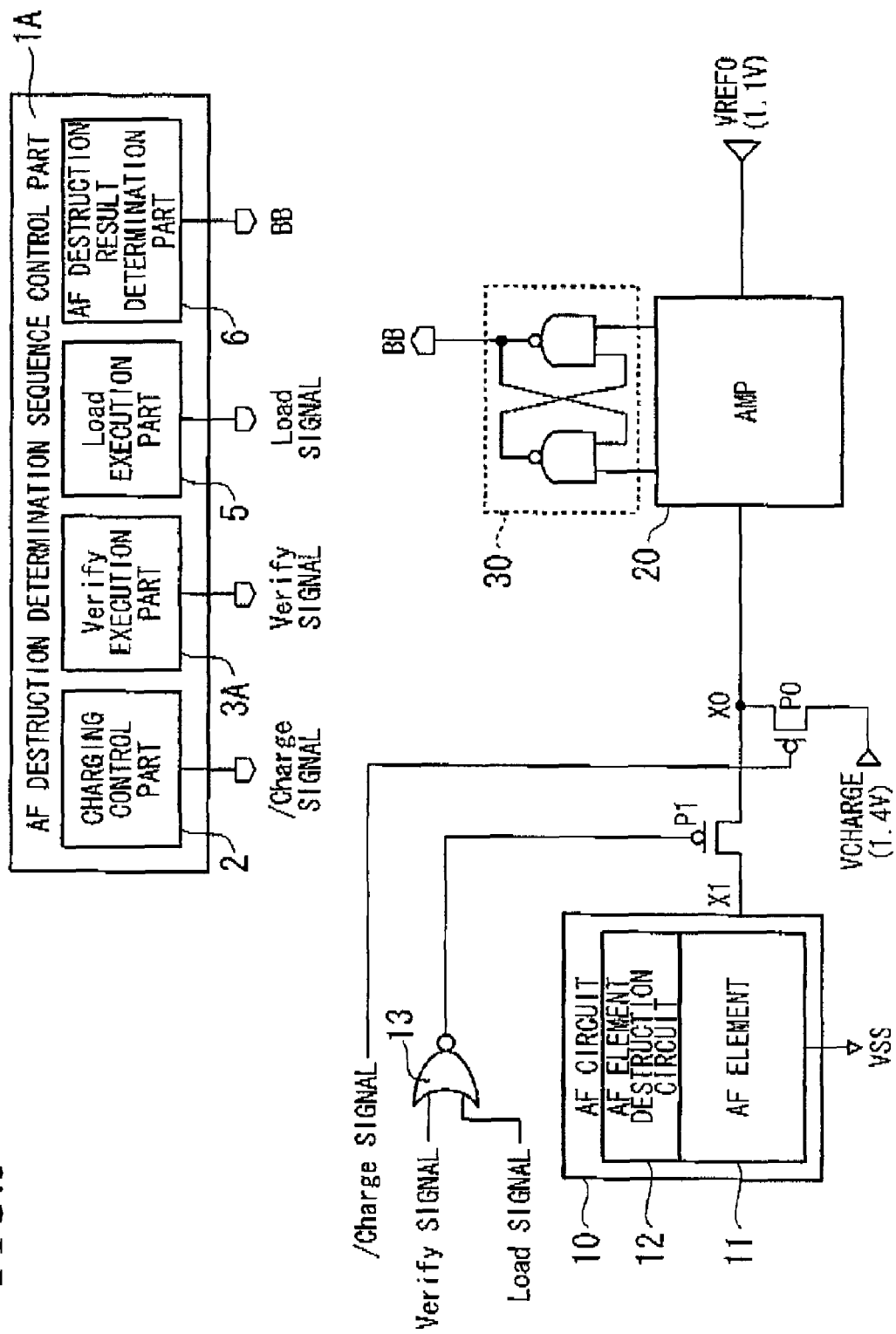
FIG. 5 is a diagram showing the structure of a conventional semiconductor memory device.
Figure 6:
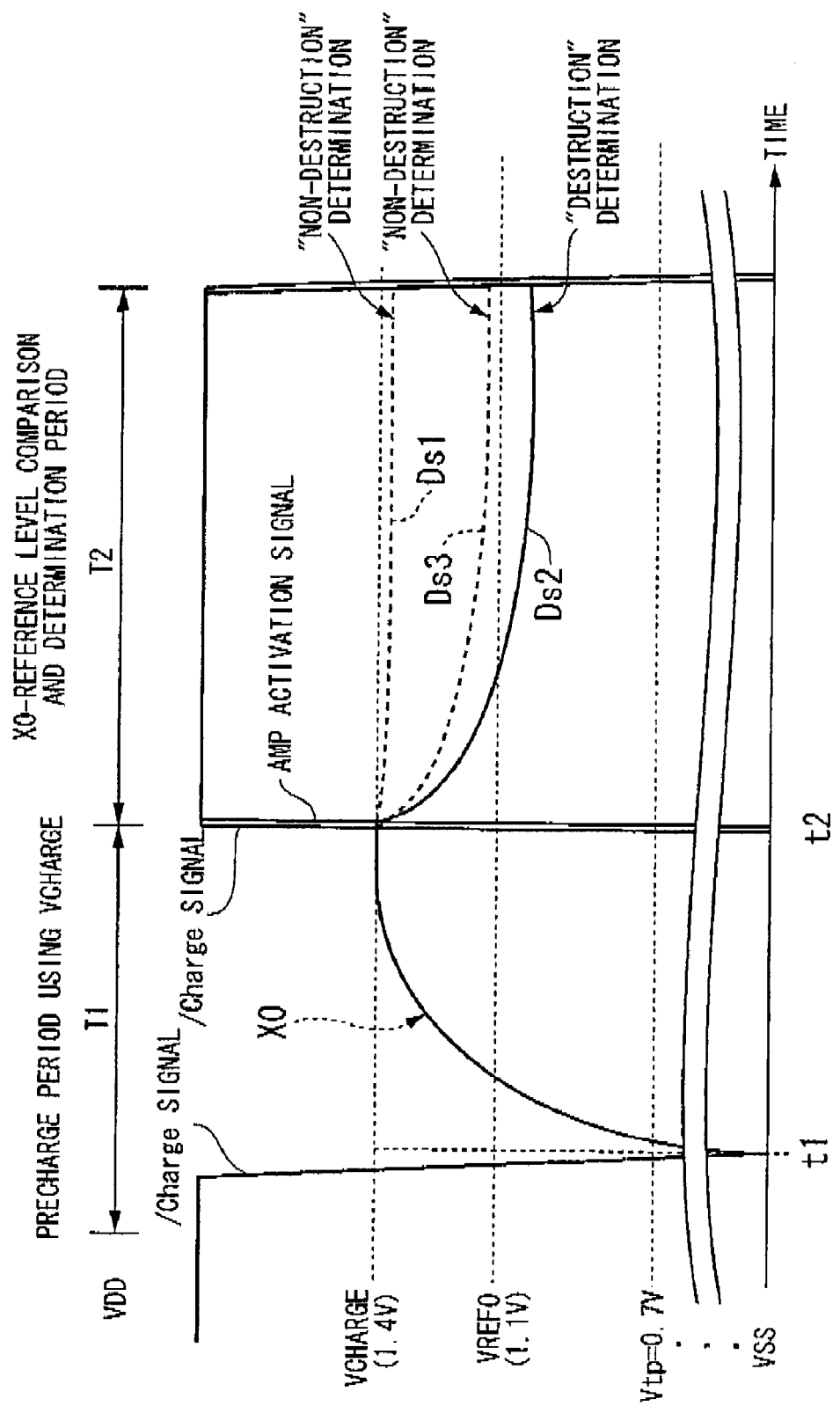
FIG. 6 is a diagram for explaining the AT destruction determination with respect to the conventional semiconductor memory device.

The AF circuit 10, which includes the AF element 11 and the AF element destruction circuit 12, has already been explained with reference to FIG. 5, which shows a conventional structure. Therefore, duplicate explanations thereof are omitted.

The gate of the P-channel transistor P1 is connected to the output of a NOR circuit 14, to which the Verify1, Verify2, and Load signals are input. In the present embodiment, two operational modes such as the Verify1 and Verify2 processes, are provided in the Verify process. Therefore, in the Verify1, Verify2, or Load operation, control is performed so that the P-channel transistor P1 is switched on, so that the nodes X0 and X1 conduct each other.

Additionally, in the Verify1, Verify2, and Load operations, the P-channel transistor P0 is switched on when charging the nodes X0 and X1 to an initial precharge level (e.g., 1.4V).

In the Verify1 operation, the comparison and detention circuit 21 ("AMP-V1") compares the potential of the node X0 with the reference level VREF1 (e.g., 1.35V). In the Verify2 operation, the comparison and determination circuit 22 ("AMP-V2") compares the potential of the node X0 with the reference level VREF2 (e.g., 0.95V). In the Load operation, the comparison and determination circuit 23 ("AMP-VL") compares the potential of the node X0 with the reference level VREF0 (e.g., 1.1V).

The flip-flop circuits 31 to 33, which respectively correspond to the comparison and determination circuits 21 to 23, respectively latch (i.e., store) the results of determination output from the comparison and determination circuits 21 to 23. The signals output from the flip-flop-circuits 31 to 33 are respectively input into transfer gates 41 to 43 which respectively correspond to the flip-flop circuits 31 to 33. The transfer gates 41 to 43 each include a P-channel transistor, an N-channel transistor, and a gate circuit, and are provided for selecting and outputting one of a plurality of input signals (i-e., input from the flip-flop circuits 31 to 33).

In the Verify1 operation, the result of determination (by the comparison and determination circuit 21), which is stored in the flip-flop circuit 31, is transmitted via the transfer gate 41 in accordance with the Verify1 signal, and is output as the determination result BB.

In the Verify2 operation, the result of determination (by the comparison and determination circuit 22), which is stored in the flip-flop circuit 32, is transmitted via the transfer gate 42 in accordance with the Verify2 signal, and is output as the determination result BB.

In the Load operation, the result of determination (by the comparison and determination circuit 23), which is stored in the flip-flop circuit 33, is transmitted via the transfer gate 43 in accordance with the Load signal, and is output as the determination result BB.

Figure 2:
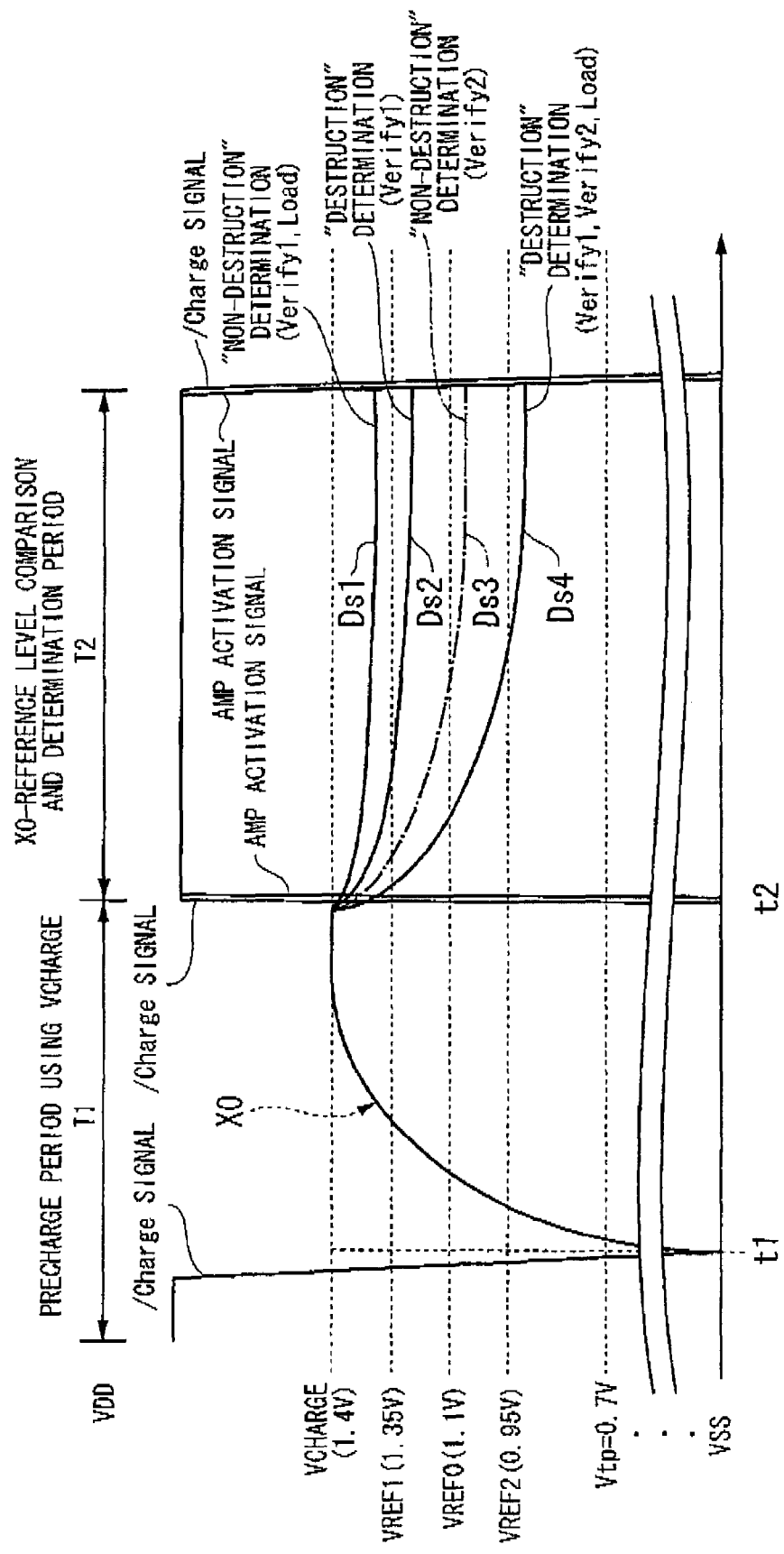
FIG. 2 is a diagram for explaining the AF destruction determination in the first embodiment.

Below, the relevant AF destruction determination in the antifuse replacement determination circuit of FIG. 1 will be explained with reference to FIG. 2. In the AF destruction determination, first, (i) the P-channel transistor PI is switched on by means of the Verify1, Verify2, or Load signal, so that the nodes X0 and X1 are conductive with each other, and (ii) the P-channel transistor PO is switched on by means of the /Charge signal (see time t1 in FIG. 2) whose level is shifted to Low (low level), so as to precharge the nodes X0 and X1 to the level VCHARGE (here, 1.4V). This process corresponds to the "precharge period T1 using VCHARGE" in FIG. 2.

Next, the level of the /Charge signal is shifted to nigh (high level) so that the "X0-reference level comparison and determination period T2" starts. When the level of the /Charge signal is set to High (see time t2), the P-channel transistor P0 is switched off, and the nodes X0 and X1 are set to be in a floating state. If the AF element has not been destroyed in this state, no charge loss occurs at the nodes X0 and X1, and thus they maintain the level VCHARGE (here, 1.4V).

In this state, first, the comparison and determination process is performed by the comparison and determination circuit 21 by using Verify1. If it is true that the AF element 11 has not been destroyed, the relevant level (i.e., 1.4V) is higher than the reference level VREF1 (1.35V) applied to the other input of the comparison and determination circuit 21, so that an AF destruction determination that the AF element has not been destroyed is obtained, and the corresponding result "Pass" is stored in the flip-flop circuit 31. This result is output via the transfer gate 41 as the determination result BB (Pass).

However, if the AF element has not been normally formed in the manufacturing process, or has been destroyed for any reason although it was not intended to be destroyed (that is, in a half-destroyed state), then the AF element may discharge toward the node VSS (on the opposite side with respect to the node X1) although it has a considerably high resistance. In this case, the potential level of the AF element may decrease below the VREF1 (1.35V), and a determination result ("Fail") that the AF element has been destroyed is stored in the flip-flop circuit 31. This result is output via the transfer gate 41 as the determination result BB (Fail). As this result is opposite to the anticipated value of the Verify1 (i.e., "the AF element has not bee destroyed"), a determination result "Fail" is obtained. As such a device cannot be subjected to the AF replacement, it is disposed of as a substandard product (because there occurred a fault in the manufacturing process).

The next comparison and determination process is performed by the comparison and determination circuit 22 by using Verify2. In the comparison and determination using Verify2, if the AF element 11 has not been destroyed, then similar to the comparison and determination using Verify1, the level of the node X0 is higher than the reference level VREF2 (0.95V) for Verify2, so that an AF destruction determination that the AF element has not been destroyed is obtained, and the corresponding result is stored in the flip-flop circuit 32. This result is output via the transfer gate 42 as the determination result BB, i.e., "Pass" (of Verify2) which coincides with the anticipated value.

If the AF element has been destroyed, then when it has a relatively low resistance due to sufficient destruction thereof, and thus the potential level of the node X0 is lower than VREF2 (0.95V) for Verify2, the AF destruction determination provides a result that "the AF element has been destroyed" which coincides with the relevant anticipated value, so that the result of Verify is "Pass". However, if the destruction state is insufficient although the AF element has bee destroyed, then the potential level of the node X0 does not decrease below VREF2 (0.95V), so that it is determined that "the AF element has not been destroyed" which does not coincide with the anticipated value. Therefore, the result of Verify2 by means of the comparison and determination circuit 22 is "Fail". Similar to the convectional AF replacement, such a device is again subjected to the Store process so as to repeat the series of the relevant processes (because the destruction of the AF element is insufficient).

If it is assumed that a conventional serious problem occurs, in which the potential of the node X0 is almost equal to VREF0, that is, approximately 1.1V, then this level is considerably higher than the level of VREF2 (0.95V), so that a clear result such that "the AF element has not been destroyed" is obtained by the comparison and determination circuit 22. Accordingly, the Store process is again repeated.

Finally, the Load operation will be explained. In this operation, similar to the relevant conventional operation, the potential level of X0 is compared with the reference level VREF0 (1.1V). If the AF element has not been destroyed, then it has already determined that the potential level of X0 is higher than VREF1 (1.35V) by means of Verify1. As VREF1 is considerably higher than the present reference level VREF0 (1.1V), it is clearly determined that the AF element has not been destroyed.

If the AF element has been destroyed, then it has already determined that the potential level of X0 is lower than VREF2 (0.95V) by means of Verify2. As VREF2 is considerably lower than the reference level VREF0 (1.1V) for the Load operation, it is clearly determined that the AF element has been destroyed.

As described above, in the structure of the present embodiment, no conventional problem occurs, in which the final level of X0 is almost equal to VREF0 (1.1V) due to a half destroyed state of the AF element, and thus every time the AF replacement determination is performed, a different result may be obtained. Therefore, the AF replacement is reliably performed in the present embodiment, and no substandard product due to an erroneous AF destruction determination occurs in the rescreening process, thereby providing an anticipated increase in the yield. Also in the actual use after the shipment, no erroneous AF determination occurs, and thus no substandard market product occurs.

Figure 3:
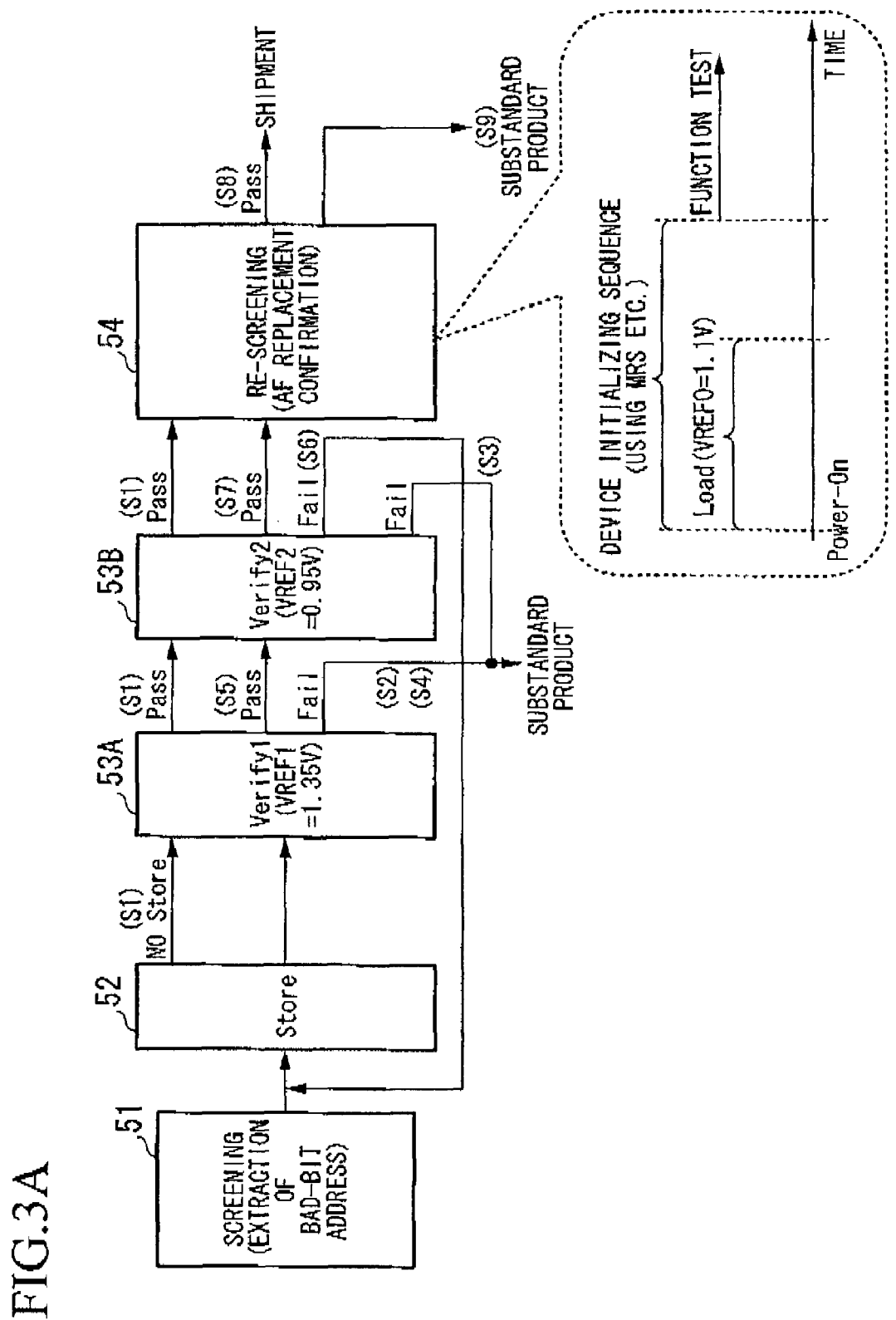
FIGS. 3A and 3B are diagrams for showing AF replacement processes with respect to the first embodiment.

FIGS. 3A and 3B are diagrams for showing AF replacement processes with respect to the present embodiment. With reference to FIGS. 3A and 3B, the AF replacement flow will be explained. Here, the antifuse replacement determination circuit of the present invention relates to a Verify1 process 53A, a Verify2 process 53B, and a relevant Load process in the figures.

In a screening process 51, a bad address is extracted from a device which is determined to be a substandard product The AF element corresponding to the above address is destroyed in a Store process 52.

If the relevant device has not been determined to be a substandard product and thus the AF element has not been destroyed, then no AF-element destruction is performed in the next Store process 52, and a Pass determination result is obtained in both the Verify1 and Verify2 processes 53A and 53B (see step S1 in FIGS. 3A and 3B).

If the potential level of X0 is lower than the reference level in the Verify1 process 53A or the Verify2 process 53B although the AF element has not been destroyed in the Store process 52, then a Fail result is obtained with respect to the Verify determination (see steps S2 and S3).

Even with respect to a sample (device) whose bad address has been defined and whose AF element has been supposed to be destroyed, if it obtains a Fail determination result through the comparison (with the reference level) in the Verify1 process 53A, then it is determined to be a substandard product (see step S4).

Also with respect to a sample whose AF element has been supposed to be destroyed, if it obtains a Pass determination result in the Verify1 process 53A (i.e., the level of X0 is lower than 1.35V, see step S5), and also obtains a Pass determination result in the Verify2 process 53B (i.e., the level of X0 is lower than 0.95, see step S7), then the destruction of the AF element is confirmed when a Pass result is also obtained in the re-screening process 54 (see step S8). If a Fault result is obtained in the re-screening process 54, the relevant device is disposed of as a substandard product (see step S9).

Also with respect to a sample whose AF element has been supposed to be destroyed, if it obtains a Pass determination result in the Verify1 process 53A (i.e., the level of X0 is lower than 1.35V), but obtains a Fault determination result in the Verify2 process 53B (i.e., the level of X0 is higher than or equal to 0.95) (see step S6), then the operation is again started from the Store process 52, and is repeated until the Pass result is obtained in both the Verify1 and Verify2 processes 53A and 53B.

In the re-screening process 54, an AF destruction determination similar to the Verify1 and Verify2 processes is performed through a DRAM initializing sequence (using an MRS (mode register set) command or the like) in which "Load" is performed using the reference level VREF0 (1.1V). The result of the determination is stored, and a bad bit is replaced by means of the AF element, so that the relevant device obtains a Pass result in the re-screening, and is forwarded for shipment.

The table of FIG. 3B shows the destruction state of the AF element each condition with respect to the Verify determination, the Verify determination (result), and the application of each sample with respect to each of steps S1 to S9.

As described above, in the structure of the present embodiment, no conventional problem occurs, in which the final level of X0 is almost equal to VREF0 (1.1V) due to a half destroyed state of the AF element, and thus every time the AF replacement determination is performed, a different result may be obtained. Therefore, the AF replacement is reliably performed in the present embodiment, and no substandard product due to an erroneous AF destruction determination occurs in the re-screening process, thereby providing an anticipated increase in the yield Also in the actual use after the shipment, no erroneous AF determination occurs, and thus no substandard market product occurs.

SECOND EMBODIMENT

Figure 4:
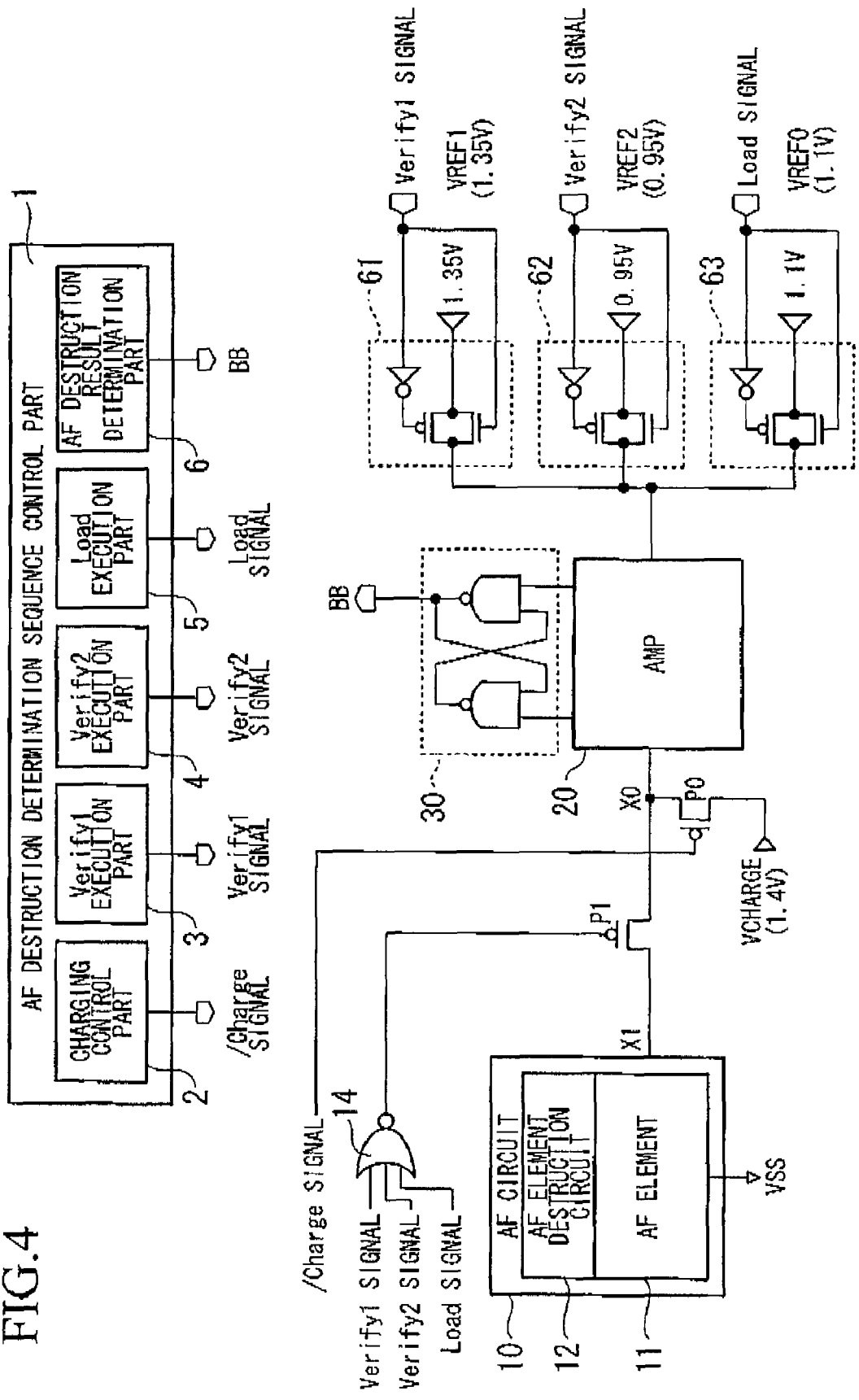
FIG. 4 is a diagram showing the structure of an antifuse replacement determination circuit of a semiconductor memory device, with respect to a second embodiment of the present invention.

FIG. 4 is a diagram showing the structure of an antifuse replacement determination circuit of a semiconductor memory device, with respect to a second embodiment of the present invention. In the antifuse replacement determination circuit in FIG. 4, the three comparison and determination circuits 21, 22, and 23 used in the antifuse replacement determination circuit in FIG. 1 are integrated as a single comparison and determination circuit 20 ("AMP"), and the flip-flop circuits 31, 32, and 33 in FIG. 1 are also integrated as a single flip-flop circuit 30.

By means of transfer gates 61, 62, and 63, switching between the respective reference levels VREF1 (1.35V), VREF2 (0.95V), and VREF0 (1.1V) is performed in accordance with each mode, that is, with the Verify1, Verify2, or Load signal. The selected reference level through the switching is input into the comparison and determination circuit 20. In this structure having an integrated single comparison and determination circuit, the area of the antifuse replacement determination circuit can be reduced. As the circuit operation is similar to that of the antifuse replacement determination circuit in FIG. 1, duplicate explanations thereof are omitted.

While preferred embodiments of the invention have been described and illustrated above, it should be understood that these are exemplary embodiments of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. An antifuse replacement determination circuit of a semiconductor memory device, wherein:
   the semiconductor memory device has a memory cell array in which data is stored in each memory cell, and the address of a bad memory cell is stored as a bad address by destroying the insulation of an antifuse element so as to replace the bad memory cell with another memory element;
   it is determined by the antifuse replacement determination circuit whether or not the replacement of the bad memory cell has been performed normally by using the antifuse element, and
   the antifuse replacement determination circuit comprises:
      an antifuse element charging circuit for charging a node of the antifuse element to have a predetermined voltage, and making the charge at the node self-discharge via the antifuse element after the charging of the node is completed;
      a comparison and determination circuit for comparing the voltage at the node of the antifuse element with a plurality of reference voltages when a predetermined time has elapsed after the completion of the charging of the node; and
      an AF destruction result determination part for determining, based on a determination result with respect to the comparison using the plurality of reference voltages in the comparison and determination circuit, whether or not the replacement of the bad memory cell has been performed normally by using the antifuse element.

2. The antifuse replacement determination circuit in accordance with claim 1, wherein:
   the comparison and determination circuit includes three comparison and determination circuits; and
   the antifuse replacement determination circuit has:
      a first comparison and determination circuit for comparing the voltage at the node of the antifuse element with a first reference voltage VREF1;
      a first latch circuit for storing a determination result with respect to the comparison of the first comparison and determination circuit;
      a second comparison and determination circuit for comparing the voltage at the node of the antifuse element with a second reference voltage VREF2, wherein VREF1>VREF2;
      a second latch circuit for storing a determination result with respect to the comparison of the second comparison and determination circuit;
      a third comparison and determination circuit for comparing the voltage at the node of the antifuse element with a third reference voltage VREF0, wherein VREF1>VREF0>VREF2;
      a third latch circuit for storing a determination result with respect to the comparison of the third comparison and determination circuit; and
      a transfer-gate part for selecting one of the determination results stored in the latch circuits and transmitting the selected result to the AF destruction result determination part.

3. The antifuse replacement determination circuit in accordance with claim 2, further comprising:
   a first determination executing part for making the first comparison and determination circuit compare the voltage at the node of the antifuse element with the first reference voltage VREF1, and transmitting the determination result stored in the first latch circuit to the AF destruction result determination part via the transfer-gate part;
   a second determination executing part for making the second comparison and determination circuit compare the voltage at the node of the antifuse element with the second reference voltage VREF2, and transmitting the determination result stored in the second latch circuit to the AF destruction result determination part via the transfer-gate part; and
   a third determination executing part for making the third comparison and determination circuit compare the voltage at the node of the antifuse element with the third reference voltage VREF0, and transmitting the determination result stored in the third latch circuit to the AF destruction result determination part via the transfer-gate part.

4. The antifuse replacement determination circuit in accordance with claim 1, wherein:
   the comparison and determination circuit has a single comparison and determination circuit; and
   the antifuse replacement determination circuit has:
      a transfer-gate part for selecting one of a first reference voltage VREF1, a second reference voltage VREF2, and a third reference voltage VREF0 for comparison with the voltage at the node of the antifuse element, and transmitting the selected reference voltage to the comparison and determination circuit, wherein VREF1>VRFF0>VREF2;
      a first determination executing part for making the transfer-gate part select the first reference voltage VREF1, and making the comparison and determination circuit compare the voltage at the node of the antifuse element with the first reference voltage VREF1;
      a second determination executing part for making the transfer-gate part select the second reference voltage VREF2, and making the comparison and determination circuit compare the voltage at the node of the antifuse element with the second reference voltage VREF2;
      a third determination executing part for making the transfer-gate part select the third reference voltage VREF0, and making tie comparison and determination circuit compare the voltage at the node of the antifuse element with the third reference voltage VREF0; and
      a single latch circuit for storing a determination result with respect to the comparison of the comparison and determination circuit.

5. The antifuse replacement determination circuit in accordance with claim 3, wherein the AF destruction result determination part determines that:
   the antifuse element is in a normal state when it is determined through the operation of the first determination executing part that the voltage at the node of the antifuse element is higher tan or equal to the first reference voltage VREF1, and the antifuse element has an anticipated value which indicates non-destruction;
   the antifuse element has a failure when it is determined through the operation of the first determination executing part that the voltage at the node of the antifuse element is lower than the first reference voltage VREF1, and the antifuse element has an anticipated value which indicates non-destruction;
   the antifuse element is in a normal state when it is determined through the operation of tie second determination executing part that the voltage at the node of the antifuse element is lower than the second reference voltage VREF2, and the antifuse element has an anticipated value which indicates destruction; and the antifuse element has a failure when it is determined through the operation of the second determination executing part that the voltage at the node of the antifuse element is higher than or equal to the second reference voltage VREF2, and the antifuse element has an anticipated value which indicates destruction.

6. The antifuse replacement determination circuit in accordance with claim 4, wherein the AF destruction result determination part determines that:

the antifuse element is in a normal state when it is determined through the operation of the first determination executing part that the voltage at the node of the antifuse element is higher than or equal to the first reference voltage VREF1, and the antifuse element has an anticipated value which indicates non-destruction;

the antifuse element has a failure when it is determined through the operation of the first determination executing part that the voltage at the node of the antifuse element is lower than the first reference voltage VREF1, and the antifuse element has an anticipated value which indicates non-destruction;

the antifuse element is in a normal state when it is determined through the operation of the second determination executing part that the voltage at the node of the antifuse element is lower than the second reference voltage VREF2, and the antifuse element has an anticipated value which indicates destruction; and the antifuse element has a failure when it is determined through the operation of the second determination executing part that the voltage at the node of the antifuse element is higher than or equal to the second reference voltage VREF2, and the antifuse element has an anticipated value which indicates destruction.

7. The antifuse replacement determination circuit in accordance with claim 5, wherein when the antifuse element has an anticipated value which indicates destruction, if it is determined through the operation of the first determination executing part that the voltage at the node of the antifuse element is lower than the first reference voltage VREF1, and it is also determined through the operation of the second determination executing part that the voltage at the node of the antifuse element is higher than or equal to the second reference voltage VREF2, then the AF destruction result determination part generates a signal for indicating a determination that the antifuse element should be destroyed again.

8. The antifuse replacement determination circuit in accordance with claim 6, wherein when the antifuse element has an anticipated value which indicates destruction, if it is determined through the operation of the first determination executing part that the voltage at the node of the antifuse element is lower than the first reference voltage VREF1, and it is also determined through the operation of the second determination executing part that the voltage at the node of the antifuse element is higher than or equal to the second reference voltage VREF2, then the AF destruction result determination part generates a signal for indicating a determination that the antifuse element should be destroyed again.

9. The antifuse replacement determination circuit in accordance with claim 5, wherein the AF destruction result determination part determines that:

the antifuse element is in a normal state when it is determined through the operation of the third determination executing part that the voltage at the node of the anise element is higher than or equal to the third reference voltage VREF0, and the antifuse element has an anticipated value which indicates non-destruction;

the antifuse element has a failure when it is determined through the operation of the third determination executing part that the voltage at the node of the antifuse element is lower than the third reference voltage VREF0, and the antifuse element has an anticipated value which indicates non-destruction;

the antifuse element is in a normal state when it is determined through the operation of the third determination executing part that the voltage at the node of the antifuse element is lower than the third reference voltage VREF0, and the antifuse element has an anticipated value which indicates destruction; and the antifuse element has a failure when it is determined through the operation of the third determination executing part that the voltage at the node of the antifuse element is higher than or equal to the third reference voltage VREF0, and the antifuse element has an anticipated value which indicates destruction.

10. The antifuse replacement determination circuit in accordance with claim 6, wherein the AF destruction result determination part determines that:

the antifuse element is in a normal state when it is determined through the operation of the third determination executing part that the voltage at the node of the antifuse element is higher than or equal to the third reference voltage VREF0, and the antifuse element has an anticipated value which indicates non-destruction;

the antifuse element has a failure when it is determined through the operation of the third determination executing part that the voltage at the node of the antifuse element is lower than the third reference voltage VREF0, and the antifuse element has an anticipated value which indicates non-destruction;

the antifuse element is in a normal state when it is determined through the operation of the third determination executing part that the voltage at the node of the antifuse element is lower than the third reference voltage VREF0, and the antifuse element has an anticipated value which indicates destruction; and the antifuse element has a failure when it is determined through the operation of the third determination executing part that the voltage at the node of the antifuse element is higher tan or equal to the third reference voltage VREF0, and the antifuse element has an anticipated value which indicates destruction.

11. The antifuse replacement determination circuit in accordance with claim 2, wherein:

the predetermined voltage applied to the node of the antifuse element is 1.4V;

the first reference voltage VREF1 is 0.35V;

the second reference voltage VREF2 is 0.95V; and the third reference voltage VREF0 is 1.1V.

12. The antifuse replacement determination circuit in accordance with claim 4, wherein:

the predetermined voltage applied to the node of the antifuse element is 1.4V;

the first reference voltage VREF1 is 0.35V;

the second reference voltage VREF2 is 0.95V; and the third reference voltage VREF0 is 1.1V.

13. An antifuse replacement determination method used in a semiconductor memory device, wherein:

the semiconductor memory device has a memory cell array in which data is stored in each memory cell, and the address of a bad memory cell is stored as a bad address by destroying the insulation of an antifuse element so as to replace the bad memory cell with another memory element;

it is determined by the antifuse replacement determination method whether or not the replacement of the bad memory cell has been performed normally by using the antifuse element; and the antifuse replacement determination method comprises:

an antifuse element charging step of charging a node of the antifuse element to have a predetermined voltage, and making the charge at the node self-discharge via the antifuse element after the charging of the node is completed;

a comparison and determination step of comparing the voltage at the node of the antifuse element with a plurality of reference voltages when a predetermined time has elapsed after the completion of the charging of the node; and an AF destruction result determination step of determining, based on a determination result with respect to the comparison using the plurality of reference voltages in the comparison and determination step, whether or not the replacement of the bad memory cell has been performed normally by using the antifuse element.

* * * * *

UNITED STATES PATENT AND TRADEMARK OFFICE
CERTIFICATE OF CORRECTION

| | | |
|---|---|---|
| PATENT NO. | : 7,672,186 B2 | Page 1 of 1 |
| APPLICATION NO. | : 12/129168 | |
| DATED | : March 2, 2010 | |
| INVENTOR(S) | : Masamichi Ogishima | |

It is certified that error appears in the above-identified patent and that said Letters Patent is hereby corrected as shown below:

In the Specification:

Column 1, Line 53, delete "AY circuit" and insert --AF circuit--.

Column 4, Line 9, delete "rescreening" and insert --re-screening--.

Column 4, Line 49, delete "AM Element" and insert --AF Element--.

Column 7, Line 27, delete "Tree" and insert --Three--.

Column 7, Line 37, delete "Man" and insert --than--.

Column 7, Line 45, delete "Lower T the" and insert --Lower than the--.

Column 8, Line 10, delete "Fist" and insert --first--.

Column 8, Line 15, delete "higher tan" and insert --higher than--.

Column 8, Line 40, delete "The ant se" and insert --the antifuse--.

Signed and Sealed this

Seventh Day of September, 2010

David J. Kappos
*Director of the United States Patent and Trademark Office*